United States Patent
Vahid Far et al.

(10) Patent No.: US 11,532,259 B2
(45) Date of Patent: Dec. 20, 2022

(54) ROW DRIVER CONFIGURATION

(71) Applicant: Apple Inc., Cupertino, CA (US)

(72) Inventors: Mohammad B Vahid Far, San Jose, CA (US); Hopil Bae, Sunnyvale, CA (US); Mahdi Farrokh Baroughi, Santa Clara, CA (US); Xiaofeng Wang, San Jose, CA (US)

( * ) Notice: Subject to any disclaimer, the term of this patent is extended or adjusted under 35 U.S.C. 154(b) by 0 days.

(21) Appl. No.: 15/764,257

(22) PCT Filed: Sep. 20, 2016

(86) PCT No.: PCT/US2016/052695
§ 371 (c)(1),
(2) Date: Mar. 28, 2018

(87) PCT Pub. No.: WO2017/053317
PCT Pub. Date: Mar. 30, 2017

(65) Prior Publication Data
US 2018/0286300 A1 Oct. 4, 2018

Related U.S. Application Data

(60) Provisional application No. 62/232,926, filed on Sep. 25, 2015.

(51) Int. Cl.
*G09G 3/00* (2006.01)
*G09G 3/3225* (2016.01)
(Continued)

(52) U.S. Cl.
CPC .......... *G09G 3/2003* (2013.01); *G09G 3/006* (2013.01); *G09G 3/3208* (2013.01);
(Continued)

(58) Field of Classification Search
CPC combination set(s) only.
See application file for complete search history.

(56) References Cited

U.S. PATENT DOCUMENTS 5,406,520 A * 4/1995 Tay .......................... G11C 8/12
365/200
5,448,260 A    9/1995 Zenda et al.
(Continued)

FOREIGN PATENT DOCUMENTS

CN    102024408 A    4/2011
JP    2005037831 A    2/2005
(Continued)

OTHER PUBLICATIONS

Invitation to Pay Additional Fees in PCT/US2016/052695 dated Dec. 20, 2016.
(Continued)

*Primary Examiner* — William Boddie
*Assistant Examiner* — Alecia D English
(74) *Attorney, Agent, or Firm* — Fletcher Yoder P.C.

(57) ABSTRACT

An electronic display includes an active area including multiple pixels. The electronic display also includes a first row driver set including a first column of row drivers and a second column of row drivers. A first active row driver in the first column of row drivers drives a first portion of the multiple pixels, and a first spare row driver in the second column of row drivers is in an inactive state. The electronic display also includes a second row driver set including a third column of row drivers and a fourth column of row drivers. A third active row driver in the third column of row drivers drives a second portion of the multiple pixels, and a second spare row driver in the fourth column of row drivers is inactive.

17 Claims, 17 Drawing Sheets

(51) Int. Cl.
    *G09G 3/20*     (2006.01)
    *G09G 3/3266*     (2016.01)
    *G09G 3/3208*     (2016.01)
    *G11C 19/28*     (2006.01)

(52) U.S. Cl.
    CPC ......... *G09G 3/3225* (2013.01); *G09G 3/3266* (2013.01); *G11C 19/287* (2013.01); *G09G 3/2022* (2013.01); *G09G 2300/0804* (2013.01); *G09G 2310/0286* (2013.01); *G09G 2320/0693* (2013.01); *G09G 2330/026* (2013.01); *G09G 2330/08* (2013.01)

(56) References Cited

U.S. PATENT DOCUMENTS

| | | | | |
|---|---|---|---|---|
| 5,781,171 | A * | 7/1998 | Kihara | G09G 3/3688 345/93 |
| 6,078,318 | A * | 6/2000 | Mori | G09G 3/3629 345/204 |
| 6,088,008 | A * | 7/2000 | Reeder | G09F 9/3026 340/3.5 |
| 7,701,425 | B2 | 4/2010 | Morita et al. | |
| 7,924,826 | B1 * | 4/2011 | Muntz | H04L 49/40 370/359 |
| 2003/0155151 | A1 * | 8/2003 | Hermanns | H01L 23/5387 174/260 |
| 2007/0040794 | A1 * | 2/2007 | Kwak | G02F 1/136259 345/100 |
| 2010/0079363 | A1 | 4/2010 | Chung et al. | |
| 2011/0063270 | A1 | 3/2011 | Minami | |
| 2012/0032911 | A1 * | 2/2012 | Jung | G06F 3/042 345/174 |
| 2013/0089175 | A1 * | 4/2013 | Mo | H04N 5/355 377/49 |
| 2014/0104153 | A1 * | 4/2014 | Ma | G09G 3/3611 345/100 |
| 2014/0333596 | A1 * | 11/2014 | Yang | G09G 3/3275 345/209 |
| 2016/0086077 | A1 * | 3/2016 | Akopyan | G06N 3/049 706/23 |

FOREIGN PATENT DOCUMENTS

WO     91/11796 A1     8/1991
WO     WO9111796     *     8/1991

OTHER PUBLICATIONS

International Search Report and Written Opinion in PCT/US2016/052695 dated Feb. 13, 2017.
Sato et al., IEEE Transactions on Consumer Electronics. vol. 41. No. 4, Nov. 1995.
Office Action for Chinese Patent Application No. 201680050040.4 dated Apr. 20, 2021, 5 pgs.

* cited by examiner

ROW DRIVER CONFIGURATION

BACKGROUND

The present disclosure relates generally to techniques for driving a display and, more particularly, to techniques for driving the display using row drivers.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Electronic displays may include row drivers and column drivers. Generally, either the row driver or the column drivers send data to pixels of the display, and the other driver (column or row) controls which pixel in the row or column actually latches and displays the data. Thus, pixels may be programmed at an intersection that is connected to a specific row driver out of multiple row drivers and a specific column driver out of multiple column drivers. However, when a row driver fails, the pixels in the row controlled by the row driver may not be accessed using the row driver, and the display may need to be disposed of or repaired.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Row drivers and column drivers may be used to distribute clock and/or emission controls and image data for an electronic display. In particular, the row and column drivers, in combination, enable the display to accurately pinpoint intersections where pixels may be programmed. For example, a micro-driver may be located at a row and column intersection accessible to the row and column drivers. Each micro-driver may drive multiple pixels, each of which may include several subpixels (e.g., red, green, and blue subpixels). The subpixels may be self-emissive organic light emitting diodes (OLEDs) or micro-light-emitting-diodes (µ-LEDs).

To reduce the likelihood of display failure, the row drivers may have redundant counterparts that increase possible complications/spacing in locating components within a display. To alleviate some complexity of trace and/or spacing, row driver sets (a primary and slave row driver) may be located at opposing ends of an active area of the display. The task allocations between the sets may include dividing the roles of each row driver by subpixel color. For example, a first row driver set may drive red sub-pixels while a second row driver set drives blue and/or green sub-pixels.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
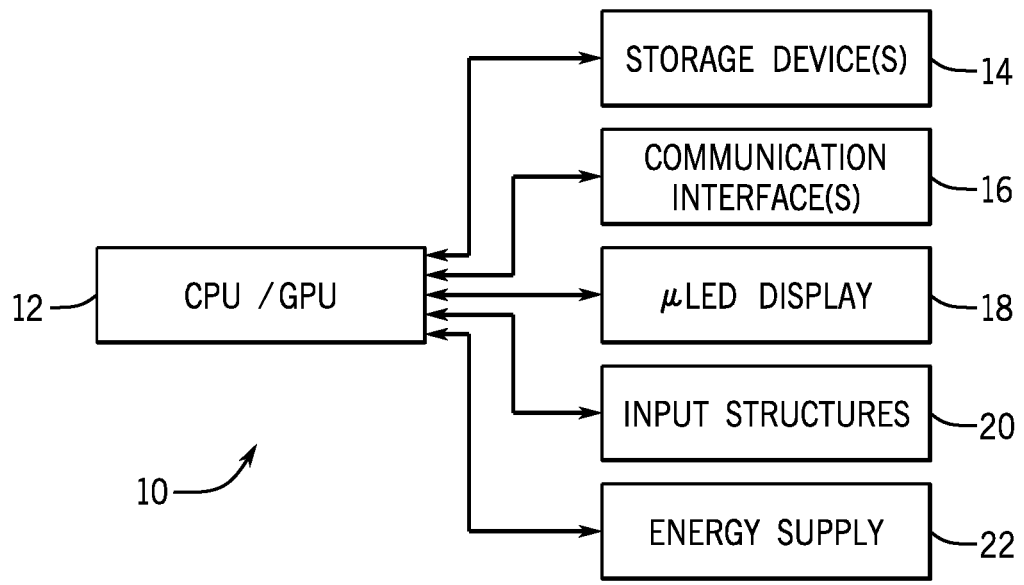
FIG. 1 is a block diagram of components of an electronic device that may include a micro-light-emitting-diode (µ-LED) display, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As discussed above, additional row driver sets and/or spare row driver in each row driver set used to drive a display may result in increased life and/or lower rejection rates of displays during manufacturing or testing without decreasing the appearance of the display. The tasks for the row drivers may be divided by pixel type (e.g., sub-pixel color) and/or locations. The row driver sets may be positionally separated. For example, the row driver sets may be disposed at opposite ends of an active area of a display. The redundant row drivers may enable better display manufacturing and/or longevity results.

The additional row drivers are to be configured to ensure that the row drivers are properly defined to be the main row driver or the spare row driver. Thus, the row drivers may be directly accessible to enable each row driver to be properly configured to the active state as the main row driver or an inactive state as the spare row driver. The row drivers may be directly accessible using hard-wired identifiers that uniquely identify each row driver. Additionally or alternatively, the row drivers may be accessible using laser cuts to change states of the row drivers. In a further embodiment, each row driver may be a "smart" row driver that communicates with row drivers upstream and downstream of itself. Such a "smart" row driver may send a main status message to a downstream row driver, waiting for a response from the downstream driver. If no confirmation is received, the row driver sends the main status message to a cross-column row driver. Additionally or alternatively, a token may be used as a rolling identifier that is passed from row driver to row driver downstream letting the row driver know that any configuration data transmitted over the configuration data line is intended for the row driver. If the row driver does not have a token, the row driver ignores data on the configuration data line.

Suitable electronic devices that may include a micro-LED (μ-LED or u-LED) display are discussed below with reference to FIGS. 1-4. One example of a suitable electronic device 10 may include, among other things, processor(s) such as a central processing unit (CPU) and/or graphics processing unit (GPU) 12, storage device(s) 14, communication interface(s) 16, a μ-LED display 18, input structures 20, and an energy supply 22. The blocks shown in FIG. 1 may each represent hardware, software, or a combination of both hardware and software. The electronic device 10 may include more or fewer components. It should be appreciated that FIG. 1 merely provides one example of a particular implementation of the electronic device 10.

The CPU/GPU 12 of the electronic device 10 may perform various data processing operations, including generating and/or processing image data for display on the display 18, in combination with the storage device(s) 14. For example, instructions that can be executed by the CPU/GPU 12 may be stored on the storage device(s) 14. The storage device(s) 14 thus may represent any suitable tangible, computer-readable media. The storage device(s) 14 may be volatile and/or non-volatile. By way of example, the storage device(s) 14 may include random-access memory, read-only memory, flash memory, a hard drive, and so forth.

The electronic device 10 may use the communication interface(s) 16 to communicate with various other electronic devices or components. The communication interface(s) 16 may include input/output (I/O) interfaces and/or network interfaces. Such network interfaces may include those for a personal area network (PAN) such as Bluetooth, a local area network (LAN) or wireless local area network (WLAN) such as Wi-Fi, and/or for a wide area network (WAN) such as a long-term evolution (LTE) cellular network.

Using pixels containing an arrangement of pixels made up of μ-LEDs, the display 18 may display images generated by the CPU/GPU 12. The display 18 may include touchscreen functionality to allow users to interact with a user interface appearing on the display 18. Input structures 20 may also allow a user to interact with the electronic device 10. For instance, the input structures 20 may represent hardware buttons. The energy supply 22 may include any suitable source of energy for the electronic device. This may include a battery within the electronic device 10 and/or a power conversion device to accept alternating current (AC) power from a power outlet.

Figure 2:
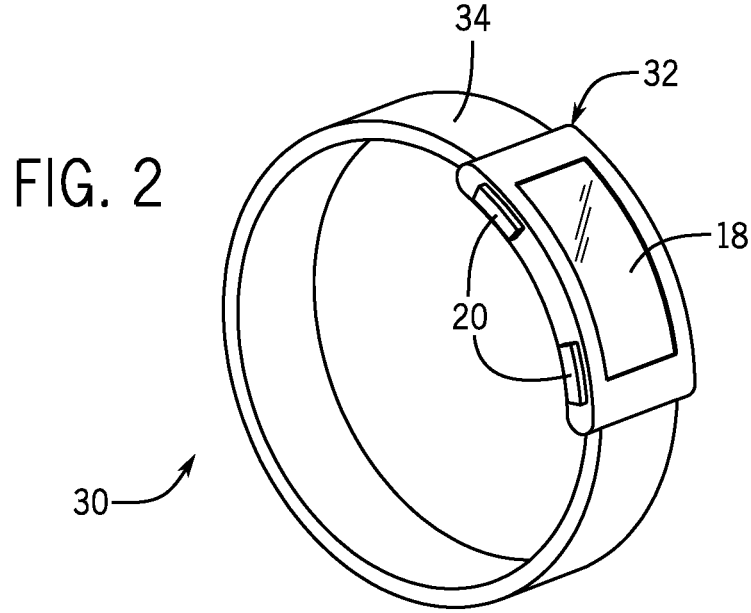
FIG. 2 is a perspective view of the electronic device in the form of a fitness band, in accordance with an embodiment.
Figure 3:
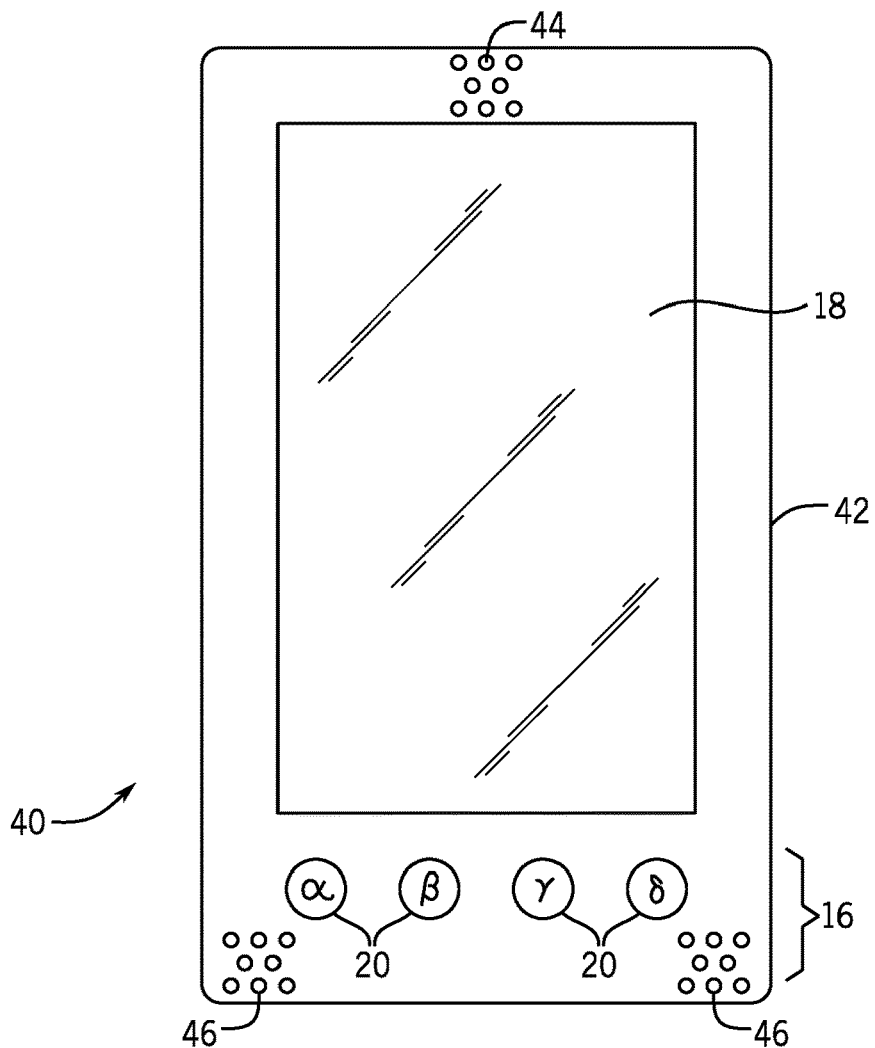
FIG. 3 is a front view of the electronic device in the form of a slate, in accordance with an embodiment.
Figure 4:
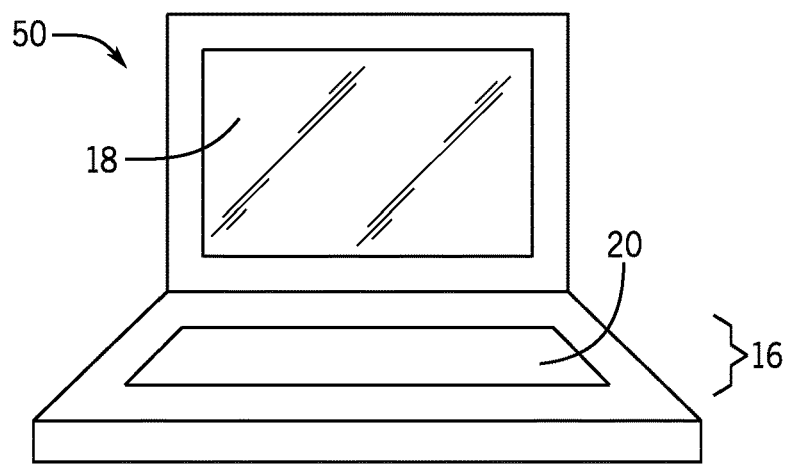
FIG. 4 is a perspective view of the electronic device in the form of a notebook computer, in accordance with an embodiment.

As may be appreciated, the electronic device 10 may take a number of different forms. As shown in FIG. 2, the electronic device 10 may take the form of a fitness band 30. The fitness band 30 may include an enclosure 32 that houses the electronic device 10 components of the fitness band 30. A strap 30 may allow the fitness band 30 to be worn on the arm or wrist. The display 18 may display information related to the operation of the fitness band 30. Additionally or alternatively, the fitness band 30 may operate as a watch, in which case the display 18 may display the time. Input structures 20 may allow a person wearing the fitness band 30 navigate a graphical user interface (GUI) on the display 18.

The electronic device 10 may also take the form of a slate 40. Depending on the size of the slate 40, the slate 40 may serve as a handheld device, such as a mobile phone, or a tablet-sized device. The slate 40 includes an enclosure 42 through which several input structures 20 may protrude. The enclosure 42 also holds the display 18. The input structures 20 may allow a user to interact with a GUI of the slate 40. For example, the input structures 20 may enable a user to make a telephone call. A speaker 44 may output a received audio signal and a microphone 46 may capture the voice of the user. The slate 40 may also include a communication interface 16 to allow the slate 40 to connect via a wired connection to another electronic device.

A notebook computer 50 represents another form that the electronic device 10 may take. It should be appreciated that the electronic device 10 may also take the form of any other computer, including a desktop computer. The notebook computer 50 shown in FIG. 4 includes the display 18 and input structures 20 that include a keyboard and a track pad. Communication interfaces 16 of the notebook computer 50 may include, for example, a universal service bus (USB) connection.

Figure 5:
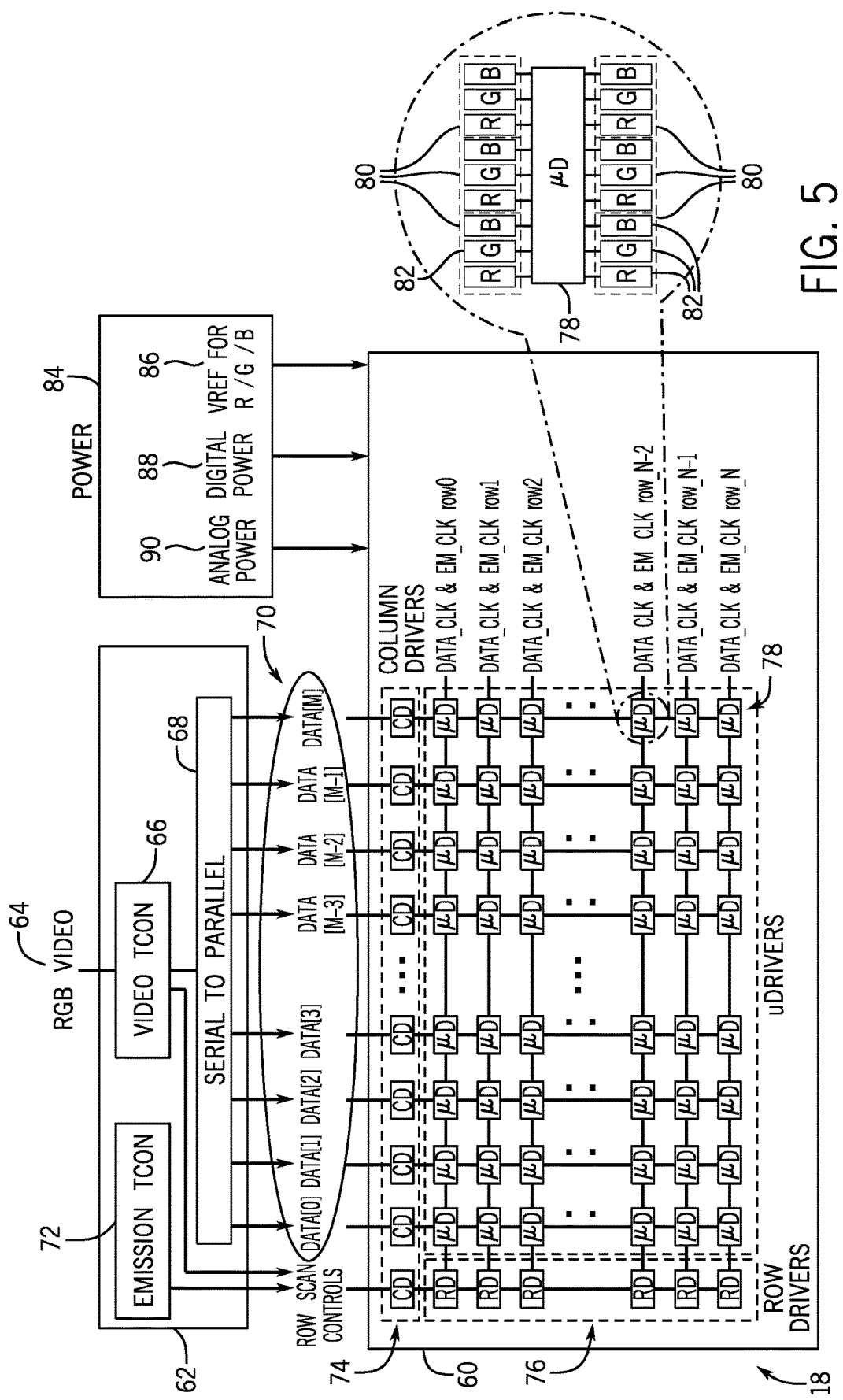
FIG. 5 is a block diagram of a µ-LED display that employs micro-drivers (µDs) to drive µ-LED subpixels with controls signals from row drivers (RDs) and data signals from column drivers (CDs), in accordance with an embodiment.

A block diagram of the architecture of the μ-LED display 18 appears in FIG. 5. In the example of FIG. 5, the display 18 uses an RGB display panel 60 with pixels that include red, green, and blue μ-LEDs as subpixels. Support circuitry 62 thus may receive RGB-format video image data 64. It should be appreciated, however, that the display 18 may alternatively display other formats of image data, in which case the support circuitry 62 may receive image data of such different image format. In the support circuitry 62, a video timing controller (TCON) 66 may receive and use the image data 64 in a serial signal to determine a data clock signal (DATA_CLK) to control the provision of the image data 64 in the display 18. The video TCON 66 also passes the image data 64 to serial-to-parallel circuitry 68 that may deserialize the image data 64 signal into several parallel image data signals 70. That is, the serial-to-parallel circuitry 68 may collect the image data 64 into the particular data signals 70 that are passed on to specific columns among a total of M respective columns in the display panel 60. As such, the data 70 is labeled DATA[0], DATA[1], DATA[2], DATA[3] . . . DATA[M−3], DATA[M−2], DATA[M−1], and DATA[M]. The data 70 respectively contain image data corresponding to pixels in the first column, second column, third column, fourth column . . . fourth-to-last column, third-to-last column, second-to-last column, and last column, respectively. The data 70 may be collected into more or fewer columns depending on the number of columns that make up the display panel 60.

As noted above, the video TCON 66 may generate the data clock signal (DATA_CLK). An emission timing controller (TCON) 72 may generate an emission clock signal (EM_CLK). Collectively, these may be referred to as Row Scan Control signals, as illustrated in FIG. 5. These Row Scan Control signals may be used by circuitry on the display panel 60 to display the image data 70.

In particular, the display panel 60 shown in FIG. 5 includes column drivers (CDs) 74, row drivers (RDs) 76, and micro-drivers (μDs or uDs) 78. Each uD 78 drives a number of pixels 80 having μ-LEDs as subpixels 82. Each pixel 80 includes at least one red μ-LED, at least one green μ-LED, and at least one blue μ-LED to represent the image data 64 in RGB format. Although the μDs 78 of FIG. 5 is shown to drive six pixels 80 having three subpixels 82 each, each μD 78 may drive more or fewer pixels 80. For example, each μD 78 may respectively drive 1, 2, 3, 4, 5, 6, 7, 8, 9, 10, 11, 12, or more pixels 80.

A power supply 84 may provide a reference voltage (VREF) 86 to drive the μ-LEDs, a digital power signal 88, and an analog power signal 90. In some cases, the power supply 84 may provide more than one reference voltage (VREF) 86 signal. Namely, subpixels 82 of different colors may be driven using different reference voltages. As such, the power supply 84 may provide more than one reference voltage (VREF) 86. Additionally or alternatively, other circuitry on the display panel 60 may step the reference voltage (VREF) 86 up or down to obtain different reference voltages to drive different colors of μ-LED.

To allow the μDs 78 to drive the μ-LED subpixels 82 of the pixels 80, the column drivers (CDs) 74 and the row drivers (RDs) 76 may operate in concert. Each column driver (CD) 74 may drive the respective image data 70 signal for that column in a digital form. Meanwhile, each RD 76 may provide the data clock signal (DATA_CLK) and the emission clock signal (EM_CLK) at an appropriate to activate the row of μDs 78 driven by the RD 76. A row of μDs 78 may be activated when the RD 76 that controls that row sends the data clock signal (DATA_CLK). This may cause the now-activated μDs 78 of that row to receive and store the digital image data 70 signal that is driven by the column drivers (CDs) 74. The μDs 78 of that row then may drive the pixels 80 based on the stored digital image data 70 signal based on the emission clock signal (EM_CLK).

Figure 6:
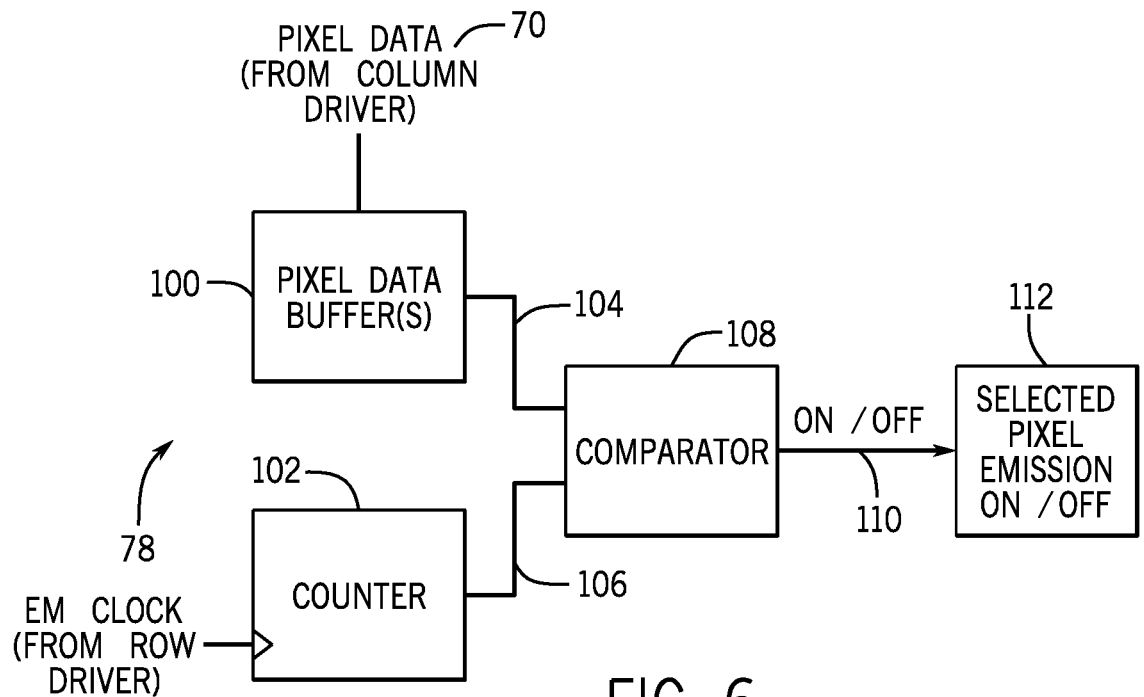
FIG. 6 is a block diagram schematically illustrating an operation of one of the micro-drivers (µDs), in accordance with an embodiment.

A block diagram shown in FIG. 6 illustrates some of the components of one of the μDs 78. The μD 78 shown in FIG. 6 includes pixel data buffer(s) 100 and a digital counter 102. The pixel data buffer(s) 100 may include sufficient storage to hold the image data 70 that is provided. For instance, the μD 78 may include enough pixel data buffer(s) 100 to store image data 70 for three subpixels 82 at any one time (e.g., for 8-bit image data 70, this may be 24 bits of storage). It should be appreciated, however, that the pixel data buffer(s) 100 may include more or fewer buffers, depending on the data rate of the image data 70 and the number of subpixels 82 included in the image data 70. Thus, in some embodiments, the pixel data buffer(s) 100 may include as few buffers as to hold image data for one subpixel 82 or as many as suitable (e.g., 4, 5, 6, 7, 8, 9, 10, 11, 12, and so forth). The pixel data buffer(s) 100 may take any suitable logical structure based on the order that the column driver (CD) 74 provides the image data 70. For example, the pixel data buffer(s) 100 may include a first-in-first-out (FIFO) logical structure or a last-in-first-out (LIFO) structure.

When the pixel data buffer(s) 100 has received and stored the image data 70, the RD 76 may provide the emission clock signal (EM_CLK). A counter 102 may receive the emission clock signal (EM_CLK) as an input. The pixel data buffer(s) 100 may output enough of the stored image data 70 to output a digital data signal 104 represent a desired gray level for a particular subpixel 82 that is to be driven by the μD 78. The counter 102 may also output a digital counter signal 106 indicative of the number of edges (only rising, only falling, or both rising and falling edges) of the emission clock signal (EM_CLK) 98. The signals 104 and 106 may enter a comparator 108 that outputs an emission control signal 110 in an "on" state when the signal 106 does not exceed the signal 104, and an "off" state otherwise. The emission control signal 110 may be routed to driving circuitry (not shown) for the subpixel 82 being driven, which may cause light emission 112 from the selected subpixel 82 to be on or off. The longer the selected subpixel 82 is driven "on" by the emission control signal 110, the greater the amount of light that will be perceived by the human eye as originating from the subpixel 82.

Figure 7:
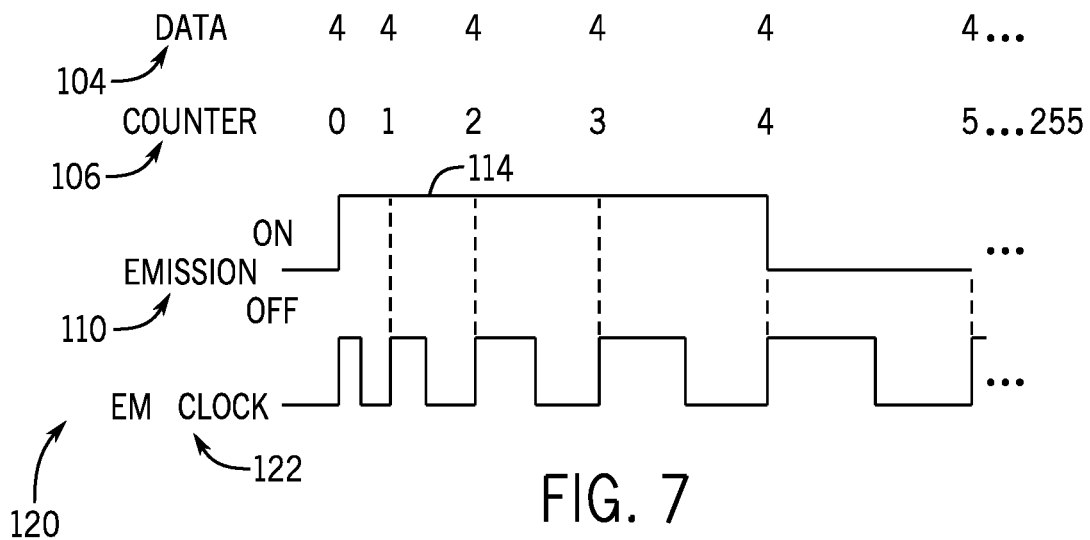
FIG. 7 is a timing diagram illustrating an example operation of the micro-driver (µD) of FIG. 6, in accordance with an embodiment.

A timing diagram 120, shown in FIG. 7, provides one brief example of the operation of the μD 78. The timing diagram 120 shows the digital data signal 104, the digital counter signal 106, the emission control signal 110, and the emission clock signal (EM_CLK) represented by numeral 122. In the example of FIG. 7, the gray level for driving the selected subpixel 82 is gray level 4, and this is reflected in the digital data signal 104. The emission control signal 110 drives the subpixel 82 "on" for a period of time defined as gray level 4 based on the emission clock signal (EM_CLK). Namely, as the emission clock signal (EM_CLK) rises and falls, the digital counter signal 106 gradually increases. The comparator 108 outputs the emission control signal 110 to an "on" state as long as the digital counter signal 106 remains less than the data signal 104. When the digital counter signal 106 reaches the data signal 104, the comparator 108 outputs the emission control signal 110 to an "off" state, thereby causing the selected subpixel 82 no longer to emit light.

It should be noted that the steps between gray levels are reflected by the timing between emission clock signal (EM_CLK) edges. That is, based on the way humans perceive light, to notice the difference between lower gray levels, the difference between the amount of light emitted between two lower gray levels may be relatively small. To notice the difference between higher gray levels, however, the difference between the amount of light emitted between two higher gray levels may be comparatively much greater. The emission clock signal (EM_CLK) therefore may use relatively short time intervals between clock edges at first. To account for the increase in the difference between light emitted as gray levels increase, the differences between edges (e.g., periods) of the emission clock signal (EM_CLK) may gradually lengthen. The particular pattern of the emission clock signal (EM_CLK), as generated by the emission TCON 72, may have increasingly longer differences between edges (e.g., periods) so as to provide a gamma encoding of the gray level of the subpixel 82 being driven.

Figure 8:
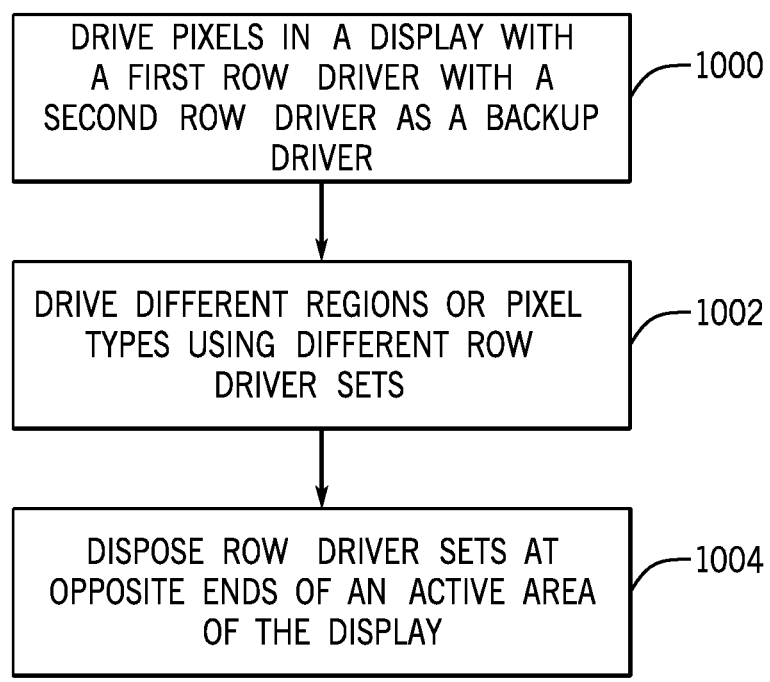
FIG. 8 is a flowchart diagram for operating a display using row drivers, in accordance with an embodiment.

FIG. 8 illustrates a process for operating a display with a microdriver. The microdriver may be coupled to two or more row drivers. These row drivers drive each display line (via the microdriver) and distribute clock and control signals across the panel while maintaining a relatively high signal integrity. Within each set of row drivers, a driving row driver drives the row, while a backup row driver is placed in a non-driving state (block 1000). For example, the non-driving or inactive state may be a high-impedance state. This backup row driver is provided as redundancy to ensure performance so that a healthy driver may be used if the other driver becomes faulty or unhealthy. Sometime during operation of the display or during configuration of the display, the row drivers are set to active or inactive states.

The display may also have different regions and/or types to be driven by different row driver sets (e.g., driving row driver and backup row driver) (block 1002). For example, a first row driver set may drive a first color (e.g., red), a second row driver set may drive remaining colors (e.g., blue, green, or white). Alternatively, a row driver set may be used for each color. Additionally or alternatively, regions of displays may be allocated different row drivers. For example, leftmost pixels in a row may be driven using a first row driver set, but right-most pixels in the row may be driven using a second row driver set.

Figure 9:
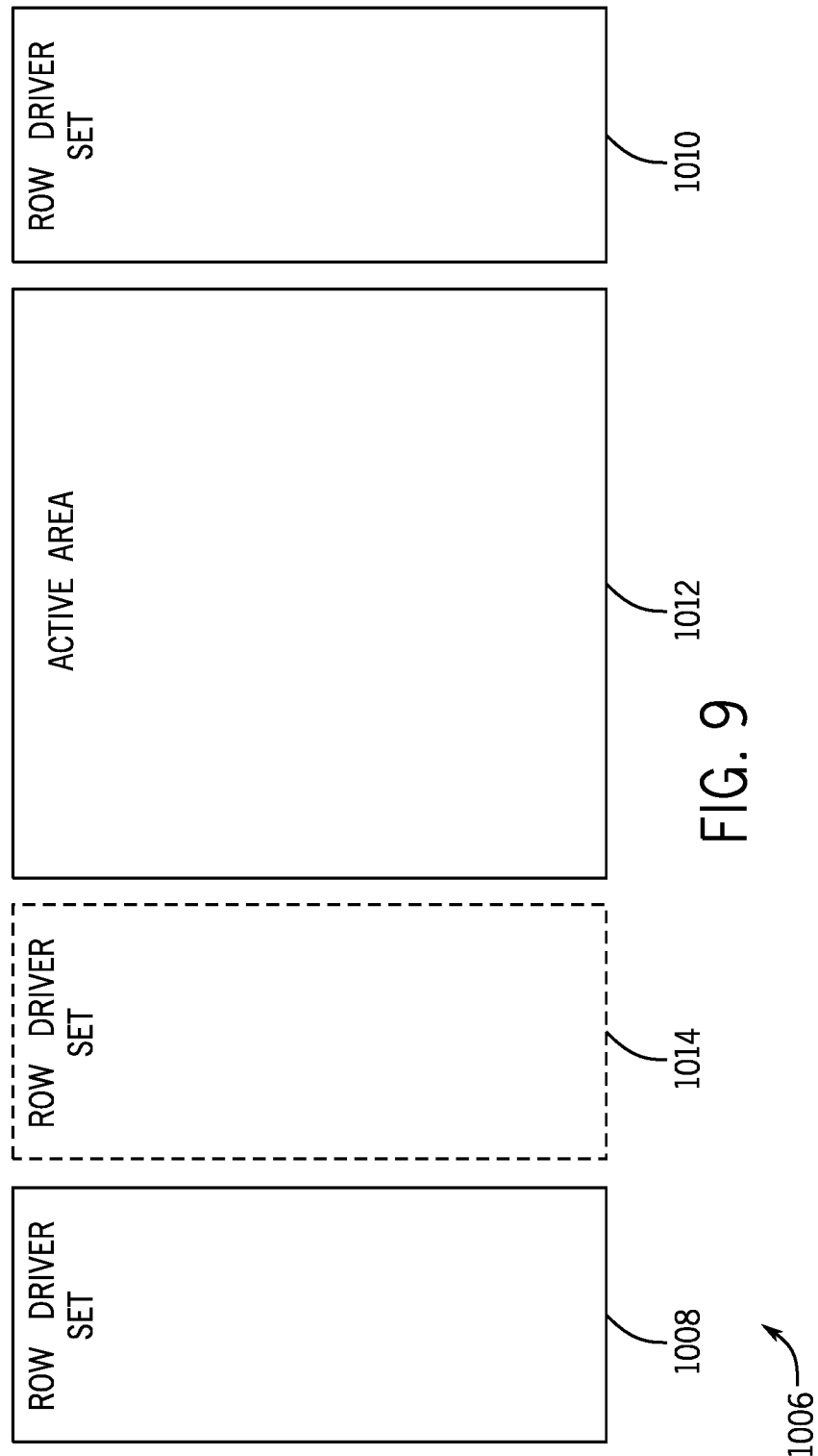
FIG. 9 is a block diagram of a display having an active area and two or more row driver sets, in accordance with an embodiment.

When a second driver set is used, the driver sets may be disposed at opposite ends of an active area (block 1004). For example, FIG. 9 illustrates a display 1006 that includes a first row driver set 1008 and a second row driver set 1010 that are disposed at opposite ends of an active area 1012 of the display 1006. In embodiments of the display 1006 having more than two row driver sets, a third row driver set 1014 is included. For example, the first row driver set 1008 may be used for red sub-pixels, the second row driver set 1010 may be used for green sub-pixels, and the third row driver 1014 may be used for blue sub-pixels. Each of the first, second, and third row set drivers 1008, 1010, and 1012 includes a driving row driver and a backup row driver.

Figure 10:
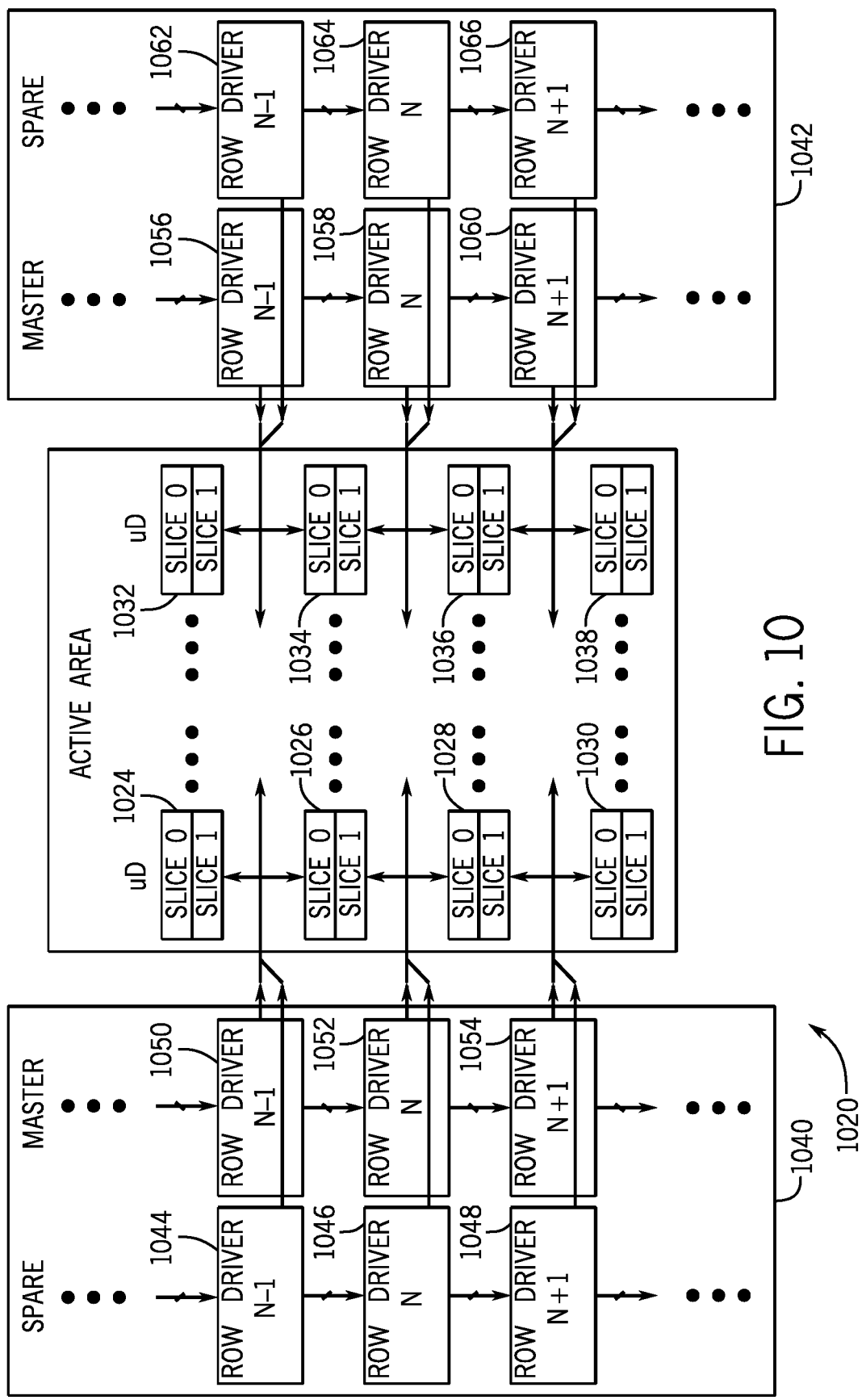
FIG. 10 is a schematic diagram of the row driver sets and active area of FIG. 9, in accordance with an embodiment.

FIG. 10 illustrates a display 1020 with row drivers. The display 1020 includes microdrivers 1024, 1026, 1028, 1030, 1032, 1034, 1036, and 1038, collectively referred to as microdrivers 1024-1038. Although only the microdrivers 1024-1038 are illustrated, additional microdrivers are included in the display 1020 but omitted from illustration for conciseness. The microdrivers 1024-1038 are driven by row driver sets 1040 and 1042. For example, red sub-pixels corresponding to each of the microdrivers 1024-1038 may be driven using the row driver set 1040 while blue/green/white sub-pixels may be driven using the row driver set 1042.

The row driver set 1040 includes master row drivers 1044, 1046, and 1048 and spare drivers 1050, 1052, and 1054. It should be appreciated that the row driver set 1040 also includes additional master and spare drivers that have been omitted for conciseness. The row driver set 1042 includes master row drivers 1056, 1058, and 1060 and spare drivers 1062, 1064, and 1066. It should be appreciated that the row driver set 1042 also includes additional master and spare drivers that have been omitted for conciseness. As can be appreciated, the driving row drivers and redundant counterparts use configurations and/or driving resolutions to properly transfer signals. However, having access to each row driver may be challenging, especially with the redundant drivers present in each set.

Hard-Wired Identifiers

Figure 11:
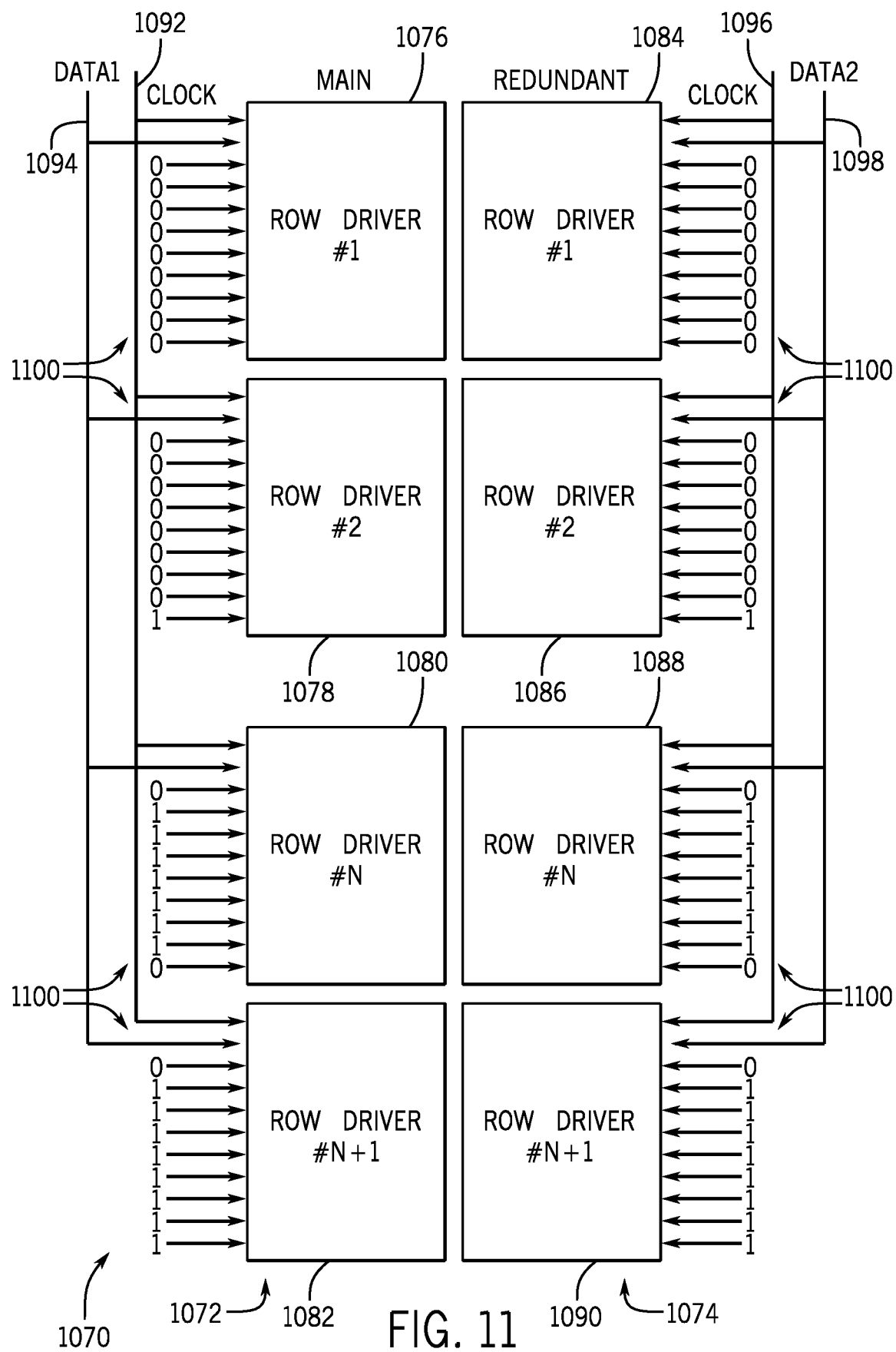
FIG. 11 is a schematic diagram of the row driver set of FIG. 10 using hard-wired identifiers for the row drivers, in accordance with an embodiment.

FIG. 11 illustrates an embodiment of a row driver set 1070 of that uses hard-wired identifiers to identify each row driver with a unique address to enable communication with individual row drivers. The row driver set 1070 includes a master row driver column 1072 and a spare row driver column 1074. The master row driver column 1072 includes row drivers 1076, 1078, 1080, and 1082. Additional, master row drivers have been omitted for conciseness, but the master row driver column 1072 includes enough row drivers to drive all of the pixels of the display. The master row drivers are primarily used to drive the microdrivers. The spare row driver column 1074 includes row drivers 1084, 1086, 1088, and 1090. Additional, master row drivers have been omitted for conciseness, but the master row driver column 1072 includes enough row drivers to drive all of the pixels of the display. The spare (redundant) row drivers are used to drive microdrivers when a respective master row driver has failed, is failing, is unhealthy, or any other suitable reason for switching from the master row driver to a corresponding spare row driver.

Each master row driver may receive a clock signal 1092 that informs the row driver to perform certain actions, such as latching received data to a corresponding microdriver. Each master row driver may receive data from a data line 1094. The received data is data that is to be transmitted to a microdriver in the row. Similarly, each spare row driver may receive a clock signal 1096 that informs the row driver to perform certain actions, such as transmitting received data to a corresponding microdriver. Each master row driver may receive data from a data line 1098. The received data is data that is to be transmitted to a microdriver in the row when the spare row driver is active.

Each row driver (master and spare) have identifier (ID) pins 1100 that uniquely identify the row driver within a column, such as the master row driver column 1072 or the spare row driver column 1074. The ID pins 1100 may be hardwired at a backplane for the display. The number of ID pins 1100 for each row driver is related to a number of rows in the display. For example, in the illustrated row driver set, each row driver has 9 ID pins 1100, because the number of row drivers in a column is less than or equal to 512. If more row drivers are to be included in a column, each row driver may have more ID pins 1100. For example, for 512-1024 pins, each row driver may have 10 pins. Thus, each driver may be uniquely accessed within its column to program the row driver at any time.

Alternatively, the number of pins may be reduced by segmentation with each segment have an individual clock. For example, 9 ID pins 1100 with a single clock may be replaced with 7 ID pins with four clocks. Thus, such segmentations approaches reduce pin allocations at the expense of additional clock and additional backplane routing. For example, the length of backplane routing may be proportional to the number of clocks. Thus, an embodiment having four clocks may have four times as much backplane routing as an embodiment having a single clock.

Figure 12:
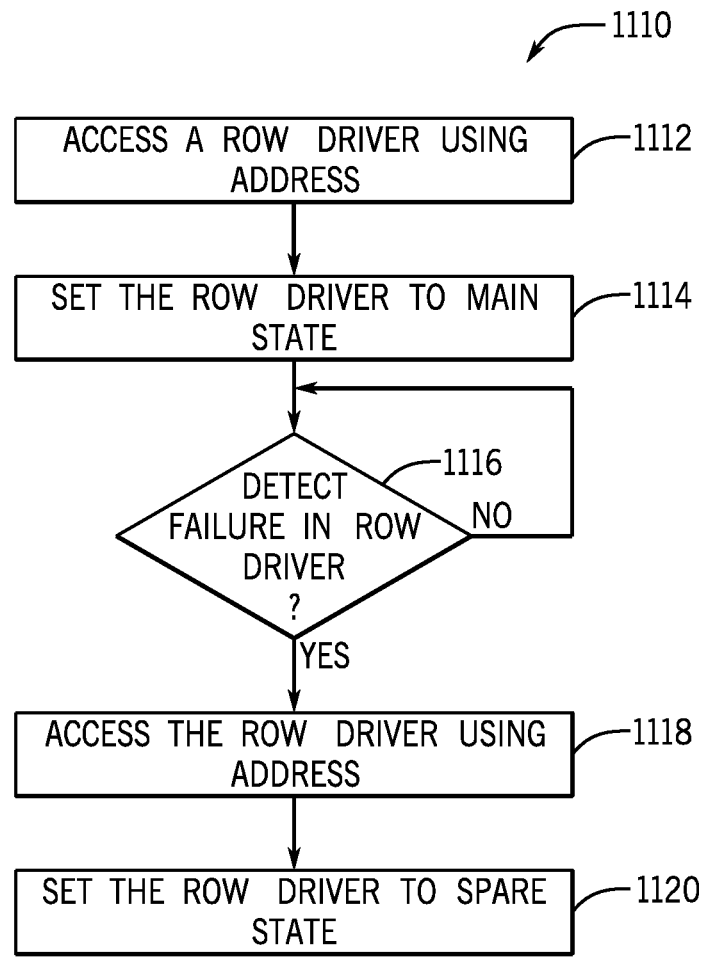
FIG. 12 is a flowchart diagram for a process for configuring row drivers in a first column of the row driver set of FIG. 10 using hard-wired identifiers, in accordance with an embodiment.

FIG. 12 illustrates a process 1110 for configuring the row drivers using hard-wired identifiers. The process 1110 includes setting the row drivers to active/main/master role or an inactive/spare/redundant role in the first column 1072. A specific row driver (e.g., row driver 1076) is accessed using the hard wired address (block 1112). Since the first column 1072 of row drivers is to default to the active/main/master role, the row driver is set to the main or active state (block 1114). During operation and/or during a calibration or configuration state, conditions of the active row drivers are tested. If a failure or unhealthy state is detected in a row driver (block 1116), the row driver is accessed using the hard-wired identifier (block 1118). Using the hard-wired identifier, the row driver is set to the spare or inactive state (block 1120).

Figure 13:
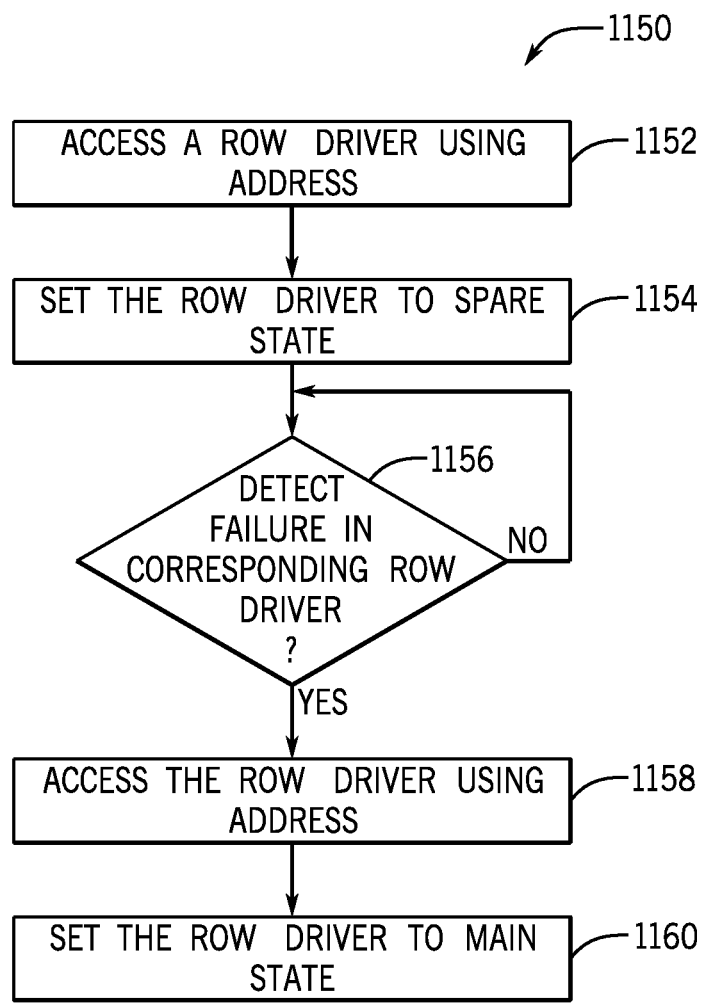
FIG. 13 is a flowchart diagram for a process for configuring row drivers in a second column of the row driver set of FIG. 10 using hard-wired identifiers, in accordance with an embodiment.

FIG. 13 illustrates a process 1150 for configuring the row drivers using hard-wired identifiers. The process 1110 includes setting the row drivers to active/main/master role or an inactive/spare/redundant role in the second column 1074. A specific row driver (e.g., row driver 1084) that corresponds to row driver in the first column 1072 is accessed using the hard wired address (block 1152). Since the second column 1074 of row drivers is to defaulted to the inactive/spare role, the row driver is set to the inactive state (block 1154). During operation and/or during a calibration or configuration state, conditions of the active row drivers are tested. If a failure or unhealthy state is detected in the row driver of the first column 1072 corresponding to the row driver of the second column 1074 (block 1156), the row driver of the second column is accessed using the hard-wired identifier (block 1158). Using the hard-wired identifier, the row driver of the second column 1074 is set to the main or active state (block 1160).

Hard-Wired Configuration Using Laser Cutting

Figure 14:
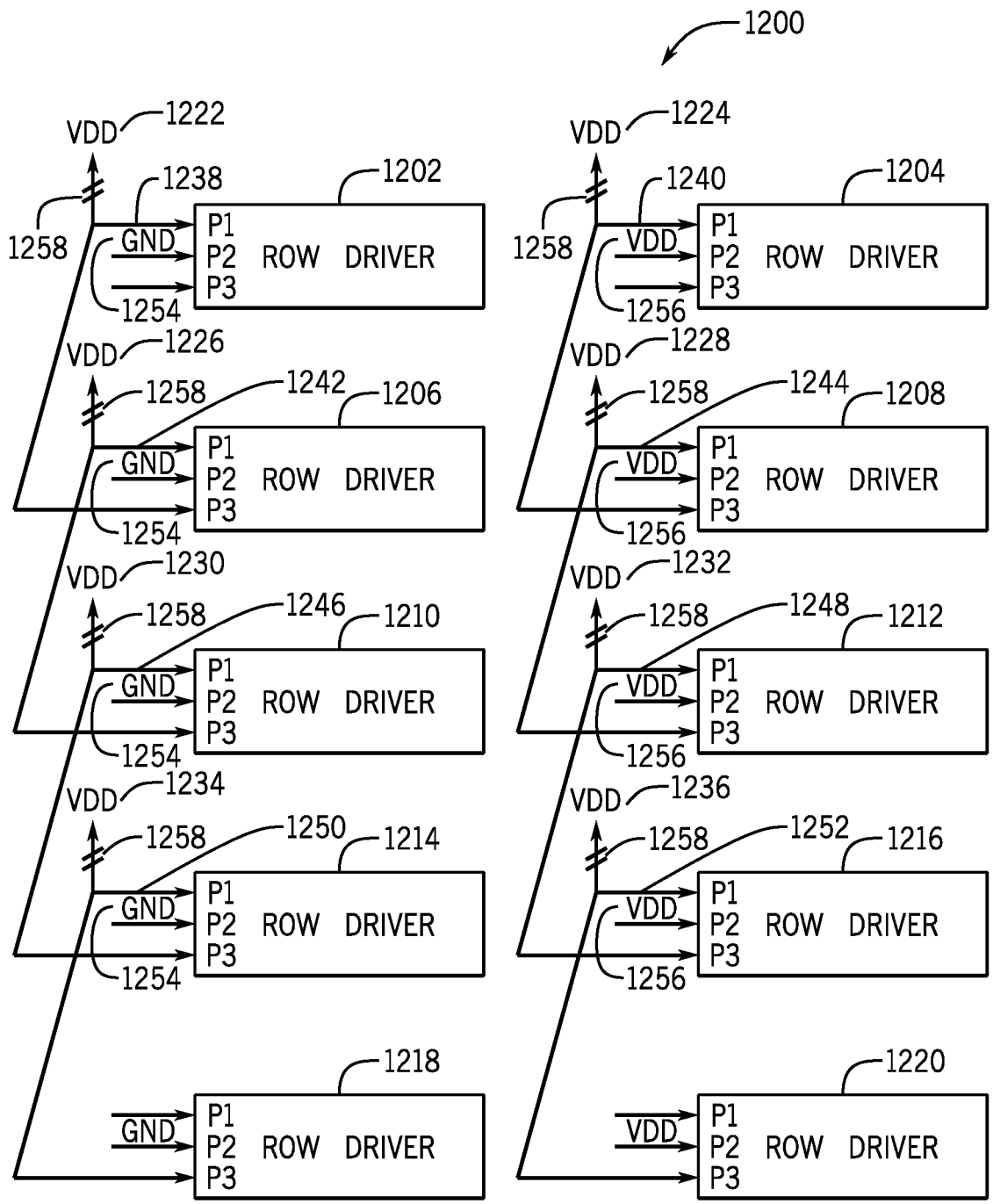
FIG. 14 is a schematic diagram of the row driver set of FIG. 10 using laser cutting disconnects to configure the row drivers, in accordance with an embodiment.

FIG. 14 illustrates a hard-wires configuration scheme for row drivers in a row driver set 1200. This may be a one time programmable scheme where row drivers are configured by laser cuts based on the outcome of functional testing. This approach may employ a lasting program of row drivers that are not re-programmed at display startup, at possible electrical glitches, or electrostatic discharge events.

As discussed below, each row driver has 3 dedicated configuration pins (P1, P2, and P3). P1 and P2, in combination, indicate whether a row driver in a certain row should have the control over the line or should be inactive with output pins in high impedance mode. P2 of the primary row drivers is hard wired to GND whereas P2 of the redundant row driver is connected to VDD. In some embodiments, P1 of both primary and redundant row drivers are connected to each other, and this common line is connected to VDD. Based on the functional test results, if a primary row driver is working properly, no action is needed. However, if the primary row driver is not working, the common connection to VDD is cut by the laser cutting process. The P2 and P3 input pin are down weakly inside the row driver to ground the pins if the common connection is cut from VDD. Based on the state of P1 and P2, a simple internal logic (e.g., xor gate) inside the row driver creates the active versus inactive row driver signal. If P1 is 1, and P2 is 0, the row driver is active and takes control of the row. Likewise, if P1 is 0, and P2 is 1, the row driver is active and takes control of the row. If the P1 and P2 are both 0 or both 1, the row driver is to be inactive, and the output of this driver is to be put in high impedance mode. P3 of the row driver controls the input signal path to the row drivers from the prior row. This pin controls a 2×1 MUX inside the row driver ensuring that the input signal to the row driver is coming from a functioning row driver in the previous row. If P3 is high (VDD), the row driver picks the signals of the primary row driver in the previous row. If P3 is low (GND), the signals of the redundant row driver in the previous row.

Initially, each of the row drivers 1202, 1204, 1206, 1208, 1210, 1212, 1214, 1216, 1218, and 1220, collectively referred to as the row drivers 1202-1220. Again, it should be noted that the row drivers 1202-1220 may only account for a portion of the number of row drivers in the display, and the display may include any suitable number of row drivers. The row drivers are initially connected via hardwire connections. Each of the row drivers 1202-1220 is initially connected to respective VDD 1222, 1224, 1226, 1228, 1230, 1232, 1234, and 1236. The VDDs may all be connected to a common return and/or to a common voltage. Alternatively, the VDDs may be different supply voltages at different voltage levels. Each VDD is coupled to respective first pin for each row driver. For example, for row driver 1202, VDD 1222 is connected to pin 1238. Similarly, VDDs 1224, 1226, 1228, 1230, 1232, 1234, and 1236 are connected to pins 1240, 1242, 1244, 1246, 1248, 1250, and 1252, respectively. The potential master row drivers have a second pin 1254 that is coupled to ground. The potential spare row drivers have a second pin 1256 that is coupled to VDD.

During a testing/configuration mode, the operation of the row drivers may be tested using test circuitry, LED(s), and camera(s) to ensure that potential master row drivers are functioning properly. If a driver is not functioning properly, a laser cut 1258 is made to disconnect a pin of the row driver from VDD. The first pin (VDD pin) of each row driver is compared to the second pin of the row driver. If the pins have the same logic, the driver is a spare row driver. If the pins have different logic, the driver is a master row driver. Thus, if the row driver 1202 failed during a test, a laser cut 1258 would be made to disconnect the first pin 1238 of the row driver 1202 from VDD 1222. The first pin of each row driver is internally pulled to ground weakly, such that when the laser cut is made, the first pin is pulled down to ground. Thus, after the laser cut 1258 disconnects the first pin 1238 of the row driver 1202 from VDD 1222, the first pin 1238 is pulled to ground. After the first pin 1238 is pulled down, the logic of the first pin 1238 and the second pin of the row driver 1202 have the same logic (e.g., ground). Therefore, the row logic 1202 is configured as a spare row driver. At the same time that the laser cut is made to disconnect the first pin 1238 of the row driver 1202 from VDD 1222, another laser cut is made to disconnect the first pin 1240 of the row driver 1204 from the VDD 1224. Thus, the first pin 1240 is pulled to ground. Since the second pin 1256 is VDD, when the first pin 1240 is pulled down, the pins have different logic. Therefore, the row driver 1204 is configured as a master row driver while the row driver 1202 is configured as the spare.

Figure 15:
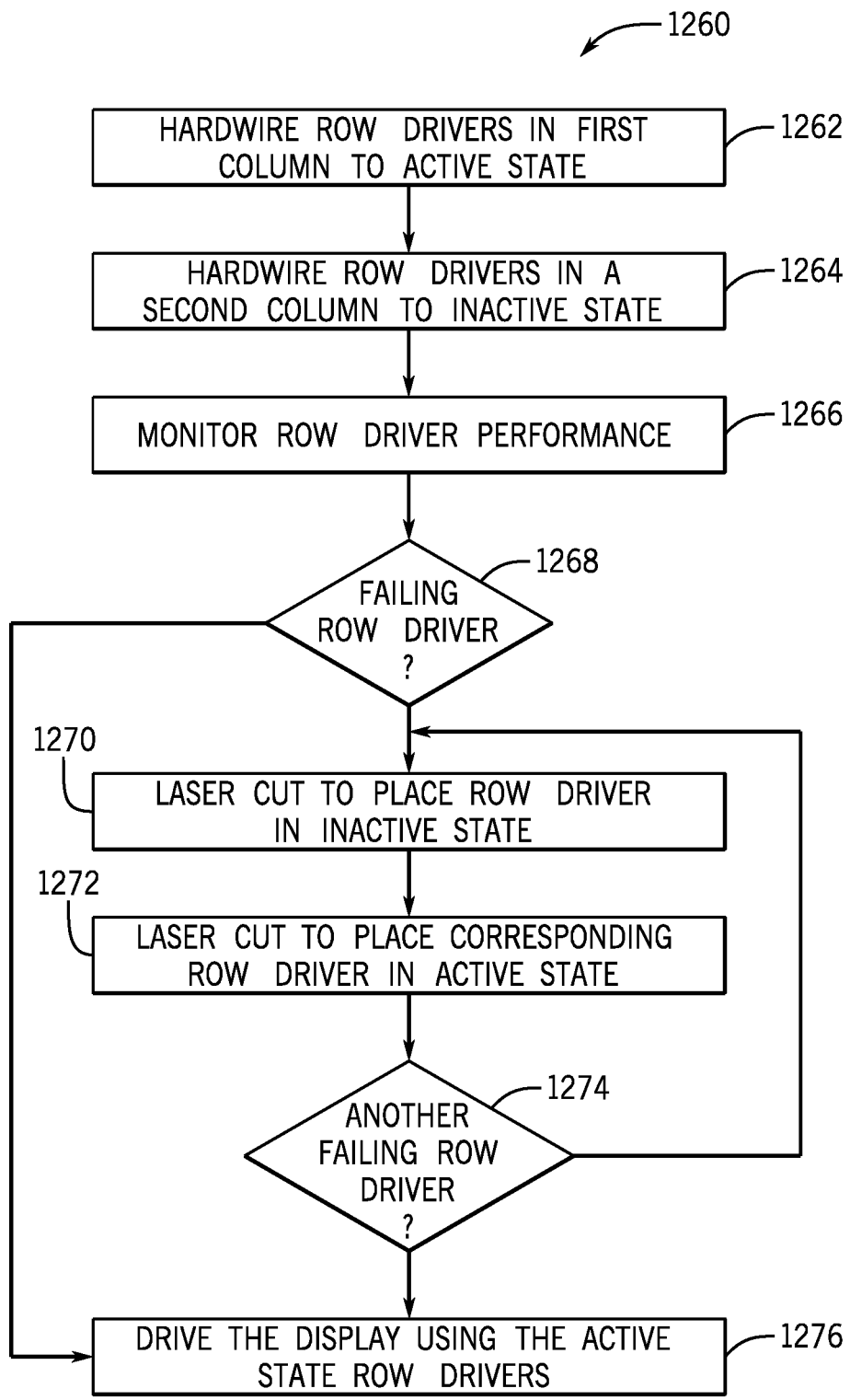
FIG. 15 illustrates a flowchart diagram of a process for configuring the row drivers of FIG. 14 using laser cutting, in accordance with an embodiment.

FIG. 15 illustrates a process 1260 for configuring row drivers in the row driver set 1200. Row drivers in a first column are hardwired to an active state (block 1262). For example, the row drivers in the first column may include row drivers 1202, 1206, 1210, 1214, and 1218. Row drivers in a second column are hardwired to an inactive state (block 1264). For example, the row drivers in the second column may include row drivers 1204, 1208, 1212, 1216, and 1220. During operation or configuration, the display monitors operation of the row driver (block 1266). For example, during operation, a camera may be used to capture brightness from the display indicating whether a specific row driver is working properly. For instance, if the row driver is not working at an intended level the brightness of a region or of a pixel may be below the proper level. If a failing (or failed) row driver has been detected (block 1268), a laser cut is made to place the row driver in an inactive state (block 1270). For example, the laser cut 1258 may disconnect a pin of the row driver from VDD. In some embodiments, the laser cut may result in a permanent disconnect. In addition to laser cutting the failing row driver, a laser cut is made to a corresponding row driver in another column to place the corresponding row driver into an active state. In some embodiments, a single common connection is used to connect the first pin of primary and corresponding spare row drivers. A single cut to this common connection, disconnects both row drivers causing the row drivers to switch roles with each other. If another failing row driver has been detected (block 1274), those failing row drivers are also placed in an inactive state while the corresponding row drivers in the second column are placed in an active state. Once all failing drivers are switched to inactive states, the display is driven using the row drivers in the active state (block 1276).

Smart Row Drivers

Figure 16:
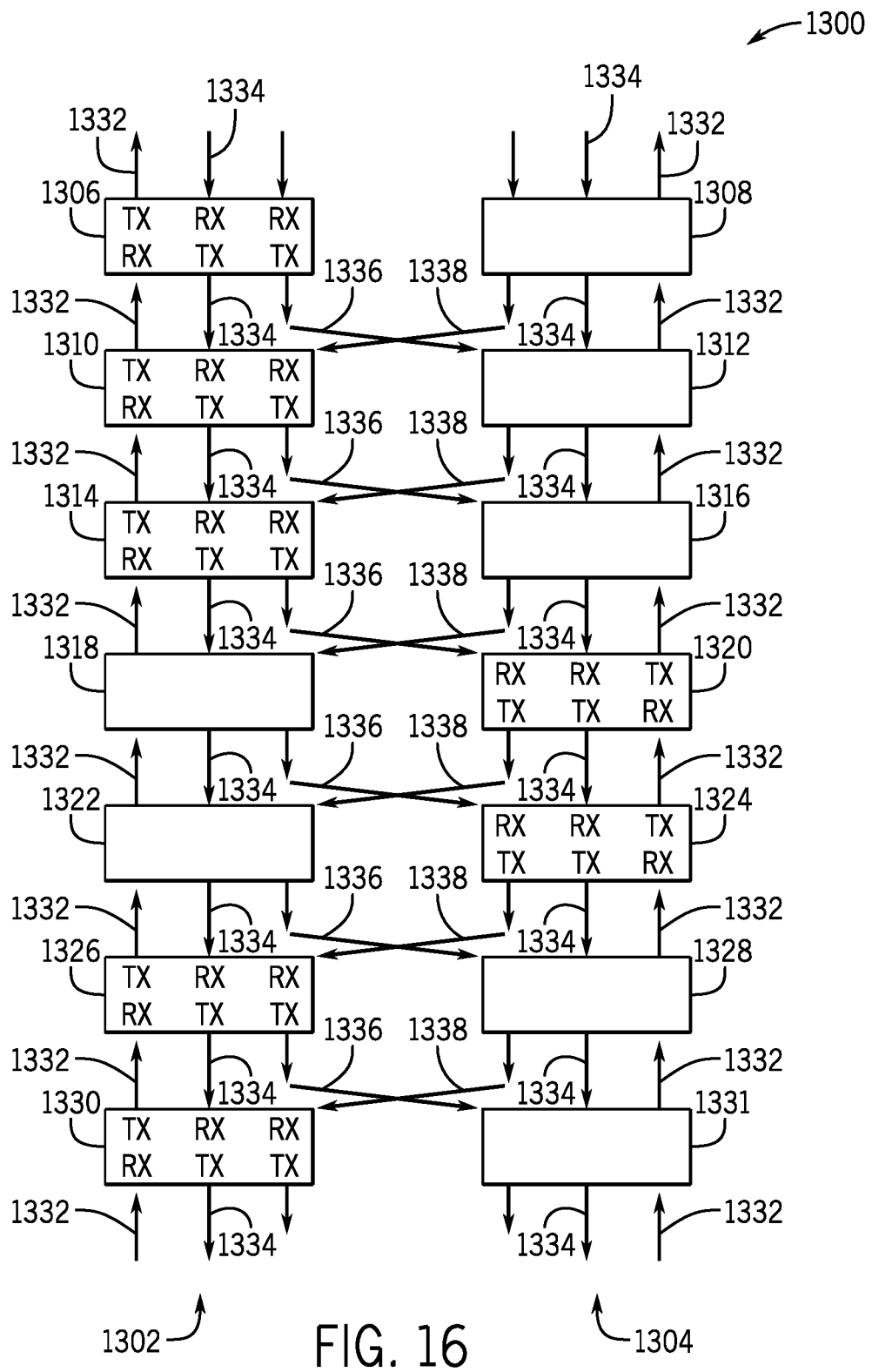
FIG. 16 illustrates a schematic view of the row driver set of FIG. 10 using smart row drivers that intercommunicate configuration statuses, in accordance with an embodiment.

FIG. 16 illustrates a smart row driver set 1300 that includes smart row drivers that are able to communicate with each other to enable configuration of the row drivers in the smart row set 1300. The smart row set 1300 includes a first column 1302 of drivers and a second column 1304 of drivers. Row drivers 1306, 1308, 1310, 1312, 1314, 1316, 1318, 1320, 1322, 1324, 1326, 1328, 1330, 1332, and 1334 may be used, when in an active state, to control access to microdrivers and their related pixels. In other words, the row driver ensures that data from the column drivers is stored and used for the proper pixels. Initially, all of the row drivers are configured as spare via a pull down within each row driver. During a configuration/calibration mode, a row driver in the first column 1302 or the second column 1304 is selected for each row of micro-drivers (μDs) 78 and/or pixels 80 in the display. To facilitate configuration, each row driver includes an up-column confirmation transmission line 1332, a down-column transmission line 1334, a cross-column transmission line 1336 or 1338.

Figure 17:
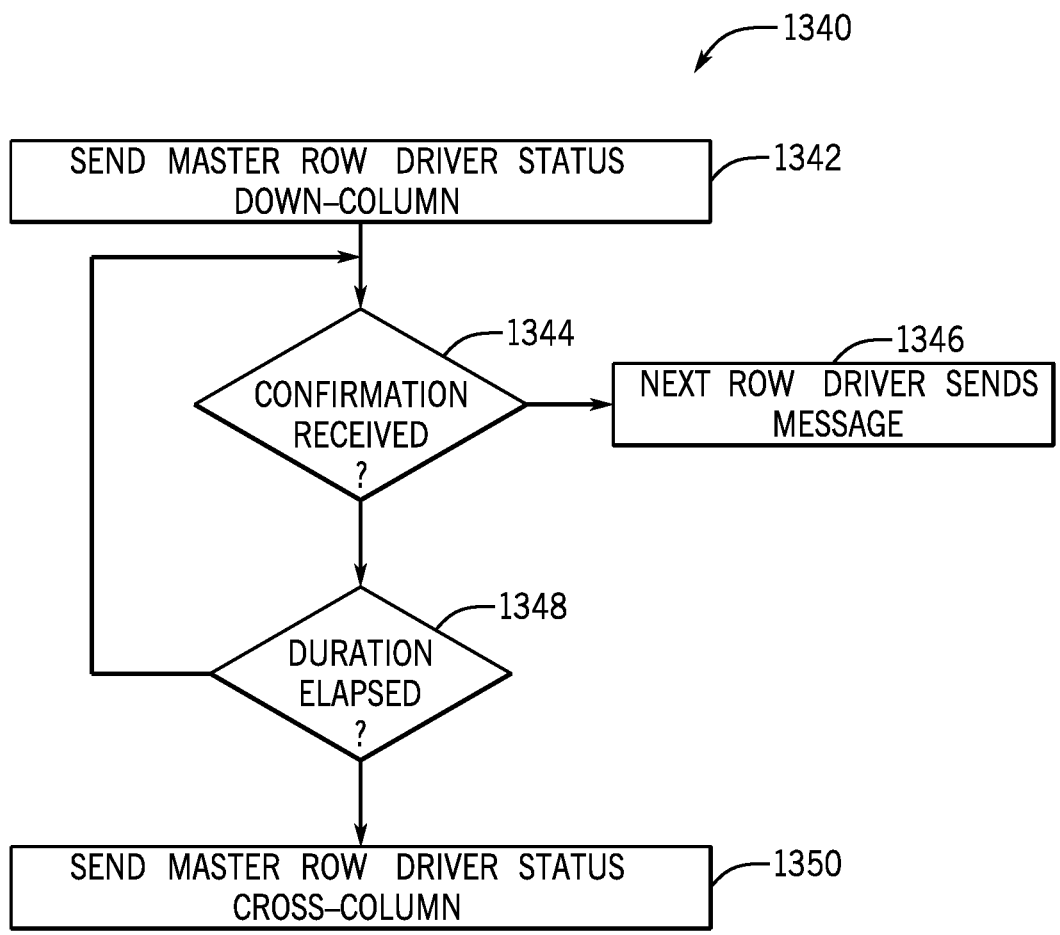
FIG. 17 illustrates a flowchart diagram of a process for configuring the row drivers of FIG. 16, in accordance with an embodiment.

FIG. 17 illustrates a smart row driver configuration process 1340. During the row driver configuration process, a row driver attempts to assign master row driver status to a down-column row driver in the same column by sending a master row driver status message to the down-column row driver via the down-column transmission line 1334 (block 1342). The row driver waits to receive a confirmation from the down-column row driver via the up-column transmission line 1332. The row driver determines whether the confirmation has been received (block 1344). If the confirmation is received, actions within the configuration mode for this row driver has ended and the next row driver sends a message (block 1346). If no confirmation is received, the row driver only waits a pre-determined period of time for the confirmation to be received from the down-column row driver. Thus, the row driver determines whether this pre-determined duration has elapsed since the status message has been transmitted down-column (block 1348). If the pre-determined period has not elapsed, the row driver continues to wait. However, if the pre-determined period has elapsed without receiving the confirmation, the row driver sends a status message cross column using the cross-column transmission line 1336 or 1338 (block 1350).

Once the confirmation has been received or the pre-determined time period has elapsed without the confirmation, the process shifts to the next row driver designated a master row driver. For example, the row driver 1306 passes master status to the row driver 1310 via the down-column transmission line 1334, and the row driver 1310 confirms receipt to the row driver 1306 via the up-column transmission line 1332. At this point, the row driver 1306 is done configuring row drivers, and the row driver 1310 picks up the process by sending a status message to the row driver 1312 via the down-column transmission line 1334. Once the last row driver has been configured, the configuration results may be latched within each row driver.

Token Passing

Figure 18:
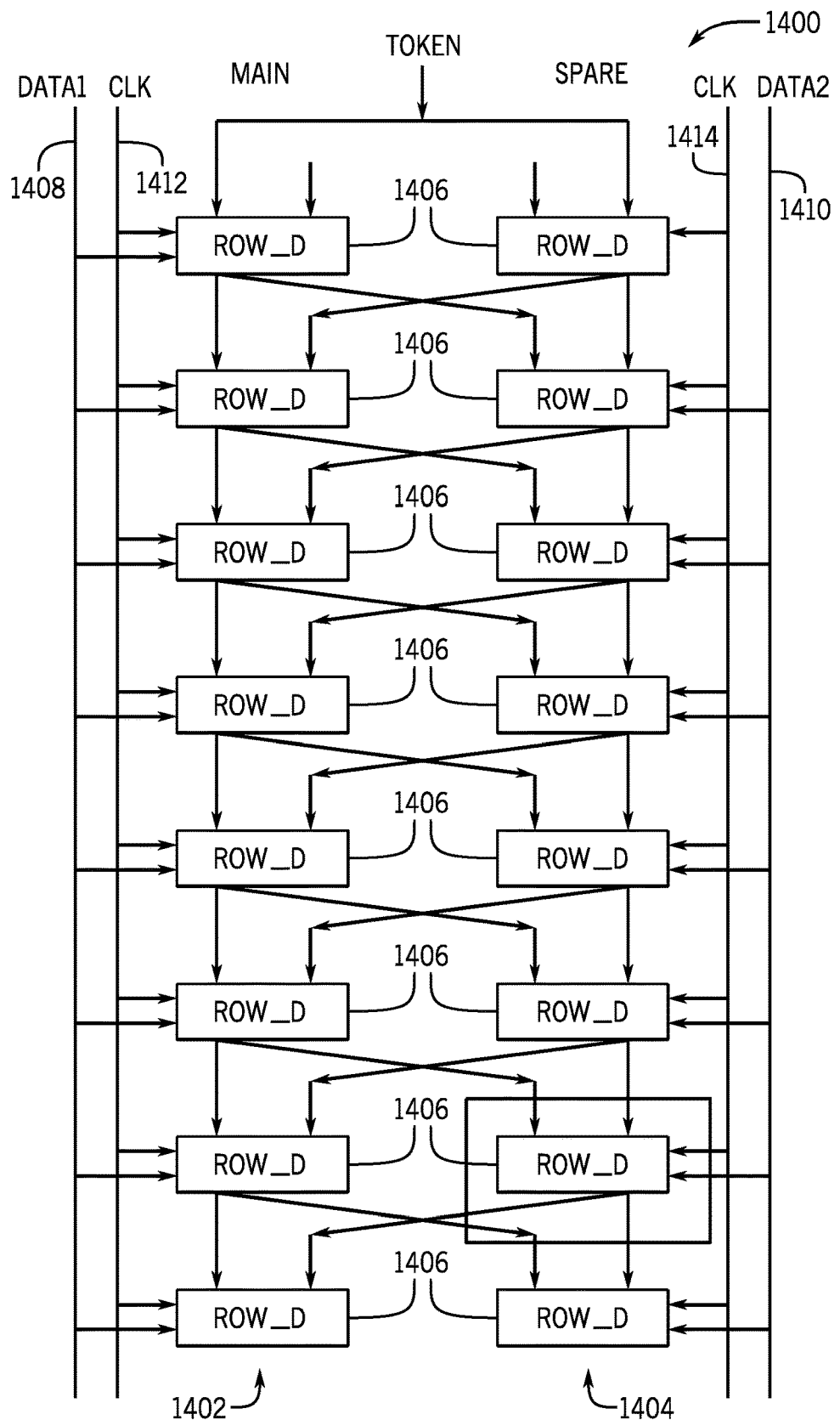
FIG. 18 illustrates a schematic view of the row driver set of FIG. 10 using token passing, in accordance with an embodiment.

FIG. 18 illustrates a row driver set 1400 that includes row drivers that pass a token to identify the row driver to be configured. The row driver set 1400 includes a first column 1402 and a second column 1404. Each row driver 1406 receives configuration data. Row drivers 1406 in the first column 1402 receive configuration data via data line 1408, and row drivers 1406 in the second column 1404 receive configuration data via data line 1410. The row drivers 1406 also receive configuration clock signals via clock signal lines 1412 and 1414. Each row driver 1406 receives a token from main and spare row drivers up-stream from the row driver 1406. For example, if the row drivers are being configured in a top-down manner, the row driver receives the token from the row drivers above, but if the row drivers are being configured in a bottom-up manner, the row driver receives the token from the row drivers below.

Figure 19:
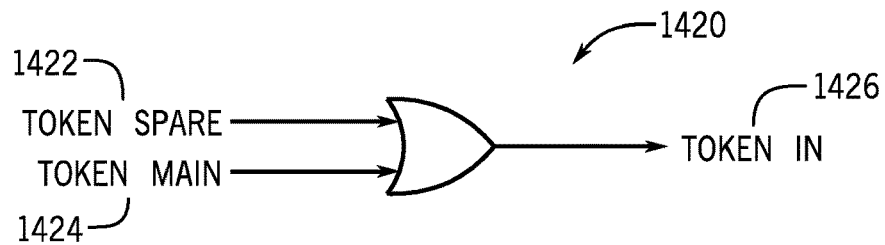
FIG. 19 illustrates a schematic view of a token combination circuit of the row driver set of FIG. 18, in accordance with an embodiment.

The row drivers pass a token to all drivers in the row driver set 1400 to configure each driver by sending the proper clock and data. The token will be rotated between all the lines one by one by a series of shift registers. Each driver passes the token to the next one(s) after it is configured. FIG. 19 illustrates an OR gate 1420. As discussed above, the row driver 1406 may receive token information from either the main or spare row driver from an up-stream row driver. An input from an up-stream spare row driver 1422 is combined with an input from an up-stream main row driver 1424 using the OR gate 1420. The resultant value is a token input 1426 used to control whether the configuration data can configure the row driver 1406.

Figure 20:
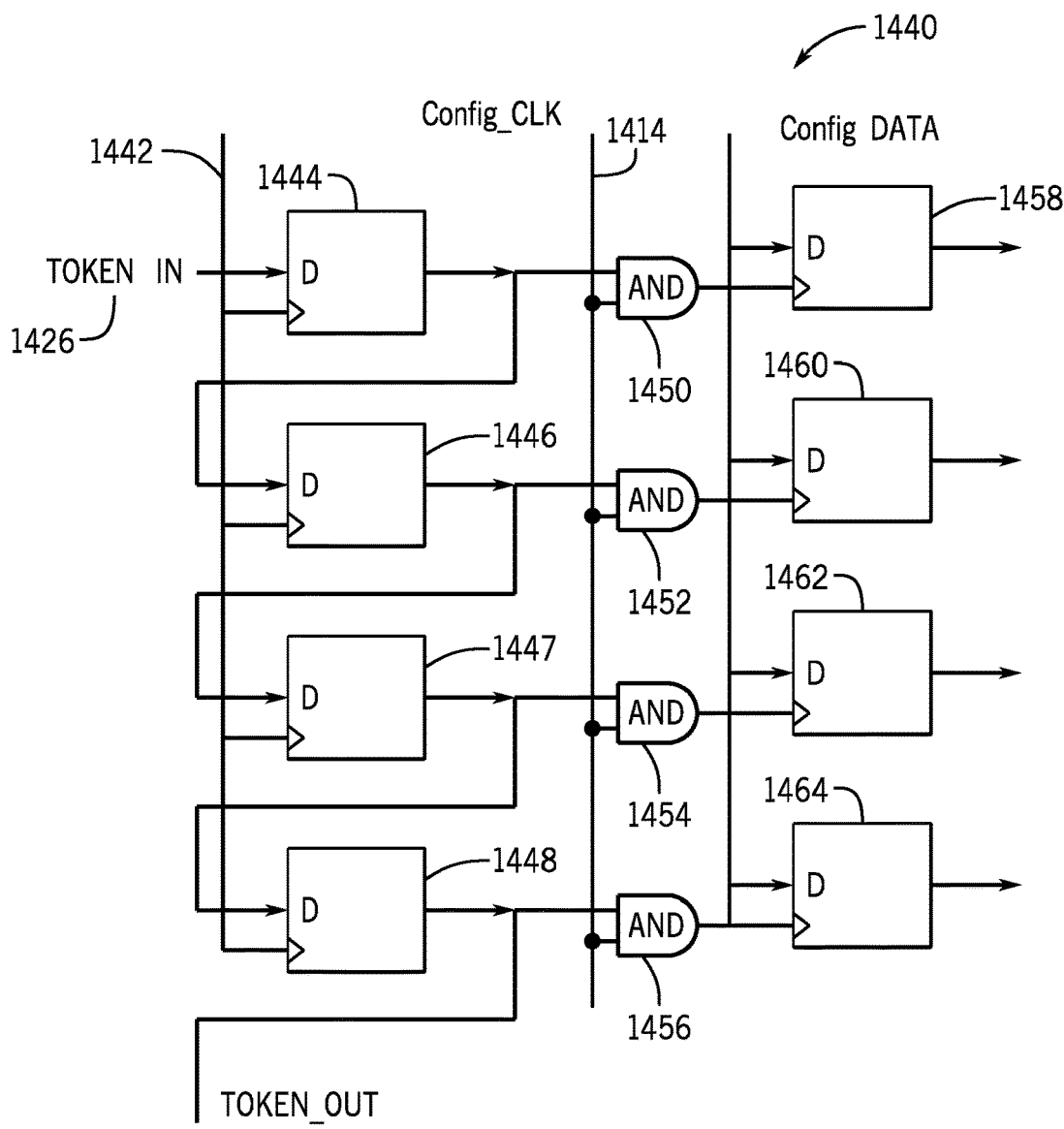
FIG. 20 illustrates a token buffer system of the row driver set of FIG. 18, in accordance with an embodiment.

FIG. 20 illustrates a shift register system 1440 used to shift and use the token input 1426. The shift register system 1440 includes receiving a token clock signal 1442 used to organize token activities. The token clock signal 1442 is used control when shift registers 1444, 1446, 1447, and 1448 latch and/or pass latched values. When the token clock signal 1442 is logic high, the shift registers 1444, 1446, 1447, and 1448 pass their latched token input 1426 values to the next shift register and an AND gate 1450, 1452, 1454, or 1456. The AND gates ensure that the token and the configuration clock 1414 are set before shift registers 1458, 1460, 1462, or 1464 are set. Once the shift register 1458, 1460, 1462, or 1464 is set, the configuration data 1410 may be latched and or passed to row driver internal configuration circuitry (e.g., set the row driver as a main row driver from the inactive/spare state).

Figure 21:
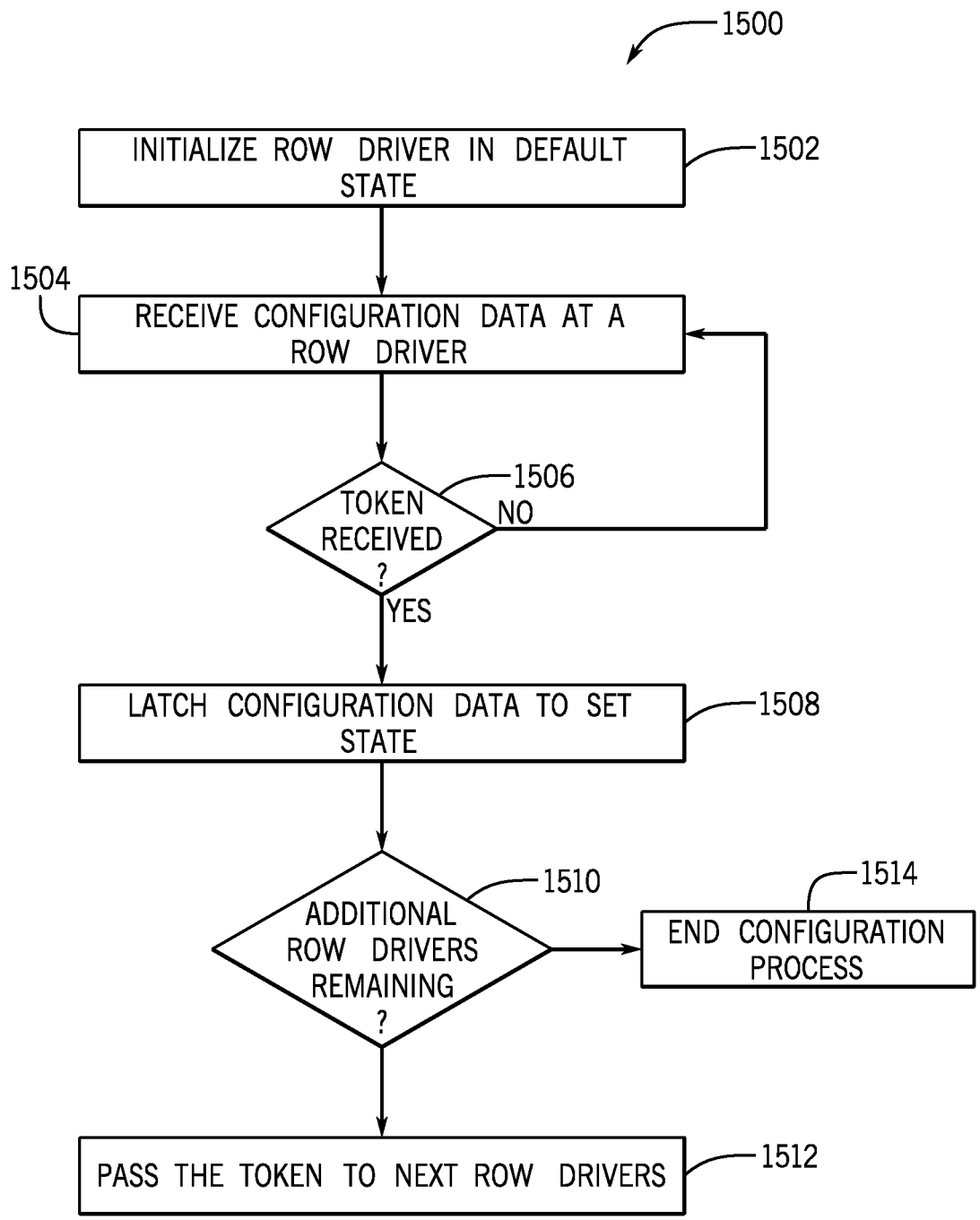
FIG. 21 illustrates a flowchart diagram for configuring the smart row drivers of FIG. 18.

FIG. 21 illustrates a flow chart for a process 1500 for configuring the row drivers 1406 using token passing. A row driver 1406 begins in a default state (block 1502). For example, the row driver may initiate in an inactive/spare state or a main/active state. Additionally or alternatively, the row driver's initial state may vary based on which column (first column 1402 or second column 1404) in which the row driver is located. The row driver receives configuration data (block 1504). The row driver determines whether a token has been received (block 1506). For example, the row driver uses and AND gate to control latching of the configuration data based on receipt of the token and a configuration clock. If the token has not been received, the row driver continues to wait for the token taking no action on the received configuration data. In other words, the token is a rolling identifier that lets the row drivers know whether the currently received configuration data is intended for that row driver or for another row driver. If the token has been received, the configuration data is latched and/or passed to configuration logic that sets the state of the row driver (block 1508). For example, if the row driver is default inactive, the configuration may switch the row driver to an active/main state. If additional row drivers exist (block 1510), the row driver passes the token to the next row drivers in the row driver set 1440 to continue the process (block 1512), and the process 1514 begins again at the new row driver. If no additional row drivers exist, the configuration process ends for this cycle (block 1514). The configuration process may begin again, but nonetheless, a cycle or iteration of configuration has been completed.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure. Moreover, although the foregoing discusses row drivers that send data to microdrivers and column drivers that control which microdriver in a row receives the data, it should be appreciated that the foregoing discussion about row drivers may be applied to column drivers and vice versa merely by rotating orientation of the display. Thus, recitations of the term "column" and "row" may refer to the reverse in some embodiments.

What is claimed is:

1. An electronic display comprising:
    an active area comprising a plurality of pixels;
    a first row driver set comprising:
        a first column of row drivers comprising a first active row driver coupled to a first portion of the plurality of pixels, wherein the first active row driver is configured to drive the first portion of the plurality of pixels; and
        a second column of row drivers comprising a first spare row driver coupled to the first portion of the plurality of pixels, wherein the first spare row driver is initially in an inactive state and comprises:
            a first pin connected to a voltage source; and
            a second pin connected to the voltage source, wherein a first conductive routing is electrically coupled between the first active row driver and the first portion of the plurality of pixels, and a second conductive routing is electrically coupled between the first spare row driver and the first portion of the plurality of pixels, and wherein a laser cut disconnects the second pin of the first spare row driver from the voltage source to activate the first spare row driver; and
    a second row driver set comprising:
        a third column of row drivers comprising a second active row driver coupled to a second portion of the plurality of pixels, wherein the second active row driver is configured to drive the second portion of the plurality of pixels; and
        a fourth column of row drivers comprising a second spare row driver coupled to the second portion of the plurality of pixels, wherein the second spare row driver is in the inactive state.

2. The electronic display of claim 1, further comprising a plurality of microdrivers configured to receive at least one signal from the first active row driver and to drive at least some of the plurality of pixels.

3. The electronic display of claim 2, wherein each microdriver is configured to drive at least two lines of pixels.

4. The electronic display of claim 3, wherein each microdriver is configured to drive 8 pixels with 4 in a first line and 4 in a second line.

5. The electronic display of claim 1, wherein the row drivers in the first row driver set are configured to drive a first color of subpixels, and the row drivers in the second row driver are configured to drive a second color of subpixels.

6. The electronic display of claim 5, wherein the first color comprises red and the second color comprises green or blue.

7. The electronic display of claim 1, wherein the first row driver set and the second row driver set are disposed at opposite ends of the active area.

8. An electronic display comprising:
    an active area comprising a plurality of pixels;
    a plurality of row drivers, wherein each row driver comprises a hard-wired identifier that uniquely identifies each row driver within the plurality of row drivers using an associated address corresponding to a plurality of identification pins hardwired at a backplane for the electronic display to facilitate configuring each row driver of the plurality of row drivers as active or inactive, the plurality of row drivers comprising:
        a first row driver set comprising:
            a first column of row drivers, wherein a first active row driver in the first column of row drivers supplies a control signal to a first portion of the plurality of pixels; and
            a second column of row drivers, wherein a first spare row driver in the second column of row drivers is in an inactive state and coupled to the first portion of the plurality of pixels; and
        a second row driver set comprising:
            a third column of row drivers, wherein a second active row driver in the third column of row drivers supplies a control signal to a second portion of the plurality of pixels; and
            a fourth column of row drivers, wherein a second spare row driver in the fourth column of row drivers is inactive and coupled to the second portion of the plurality of pixels.

9. The electronic display of claim 8 comprising:
    a microdriver receiving the control signal from the first active row driver, wherein the microdriver drives the first portion of the plurality of pixels based on the control signal; and
    a column driver, wherein the column driver provides data to the microdriver.

10. The electronic display of claim 8, wherein the first portion of the plurality of pixels comprises at least 2 pixels driven by one microdriver.

11. The electronic display of claim 8, wherein the hard-wired identifier comprises the plurality of identification pins that are segmented using one or more clocks.

12. The electronic display of claim 8, wherein the hard-wired identifier is configured to enable the row driver to determine whether configuration data is intended for the row driver.

13. The electronic display of claim 12, wherein the configuration data comprises an indication directing the row driver to be in an active state or an inactive state.

14. A display comprising,
    an active area comprising a plurality of pixels; and
    a first row driver set comprising a first column of row drivers including an active row driver, wherein the active row driver comprises:
        a first pin connected to a voltage; and
        a second pin connected to ground; and
    a second column of row drivers including an inactive row driver, wherein the inactive row driver comprises:
        a third pin connected to the voltage; and a fourth pin connected to the voltage, wherein a first conductive routing is electrically coupled between the active row driver and a portion of the plurality of pixels and a second conductive routing between the inactive row driver and the portion of the plurality of pixels, and wherein the first pin is disconnected by a laser cut to deactivate the active row driver, and wherein the third pin is disconnected by the laser cut to activate the inactive row driver.

15. The display of claim 14, wherein the second conductive routing is disconnected by coupling the third pin of the inactive row driver from the voltage to ground.

16. A method for setting a master row driver comprising:

(a) sending a master row driver status message downstream from a first row driver to a second row driver in a first column of row drivers of a display to configure the second row driver, wherein the master row driver status message is a message that is passed between row drivers of columns of row drivers to activate a row driver;

(b) determining whether a confirmation has been received at the first row driver from the second row driver within a duration, wherein the confirmation within the duration indicates configuration completion of the second row driver; and (c) if the confirmation has not been received at the first row driver within the duration, sending the master row driver status message in a cross over from the first row driver to a third row driver in a second column of row drivers, and wherein row drivers of the display are configured using the master row driver status message prior to driving pixels of the display.

17. The method of claim 16 comprising:

if confirmation has been received within the duration, shifting a master row driver configuration designation downstream to the second row driver;

if the confirmation has not been received at the first row driver within the duration, shifting a master row driver configuration designation downstream to the third row driver; and reiteratively performing acts (a)-(c) for a currently designated master row driver designated using the master row driver configuration designation until no downstream row drivers remain for the currently designated master row driver.

* * * * *